(12) United States Patent
Gorokhov et al.

(10) Patent No.: US 10,440,644 B2
(45) Date of Patent: Oct. 8, 2019

(54) METHODS AND APPARATUS FOR TURBO DECODER THROTTLING

(71) Applicant: QUALCOMM Incorporated, San Diego, CA (US)

(72) Inventors: Alexei Yurievitch Gorokhov, San Diego, CA (US); John Edward Smee, San Diego, CA (US); Michael Lee McCloud, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 396 days.

(21) Appl. No.: 13/865,261

(22) Filed: Apr. 18, 2013

(65) Prior Publication Data

US 2014/0006911 A1     Jan. 2, 2014

Related U.S. Application Data

(60) Provisional application No. 61/666,106, filed on Jun. 29, 2012.

(51) Int. Cl.
*H04L 1/00* (2006.01)
*H04W 52/02* (2009.01)
(Continued)

(52) U.S. Cl.
CPC ....... *H04W 52/0209* (2013.01); *H03M 13/09* (2013.01); *H04L 1/0053* (2013.01);
(Continued)

(58) Field of Classification Search
CPC .... G06F 11/104; G06F 11/10; G06F 11/1004; H04L 1/0061; H04L 1/0053;
(Continued)

(56) References Cited

U.S. PATENT DOCUMENTS 8,086,928 B2   12/2011   Jalloul et al.
8,107,421 B2    1/2012   Prakash et al.
(Continued)

FOREIGN PATENT DOCUMENTS

EP   2224633 A1 *  9/2010
EP   2224633 A1    9/2010
(Continued)

OTHER PUBLICATIONS

International Search Report and Written Opinion—PCT/US2013/037398—ISA/EPO—dated Jul. 12, 2013.
(Continued)

*Primary Examiner* — Samir W Rizk
*Assistant Examiner* — Enam Ahmed
(74) *Attorney, Agent, or Firm* — Patterson & Sheridan, L.L.P.

(57) ABSTRACT

Aspects of the present disclosure provide methods, apparatus and computer program products for turbo decoder throttling (e.g., in an effort to limit power consumption by a user equipment (UE)). According to an aspect, the UE may identify an error in a received code block (CB) of a transport block (TB). The UE may enter a throttle mode in a decoder at the UE in response to the identified error, wherein the throttle mode determines how one or more subsequent CBs are processed. Numerous other aspects are provided.

40 Claims, 6 Drawing Sheets

(51) Int. Cl.
*H03M 13/09* (2006.01)
*H04L 1/18* (2006.01)

(52) U.S. Cl.
CPC .......... *H04L 1/0061* (2013.01); *H04L 1/0066* (2013.01); *H04L 1/1812* (2013.01)

(58) Field of Classification Search
CPC .. H04L 1/0066; H04L 1/1812; H03M 13/091; H03M 13/09; H04W 52/0209
USPC ........................................................ 714/807
See application file for complete search history.

(56) References Cited

U.S. PATENT DOCUMENTS

| | | | |
|---|---|---|---|
| 8,301,987 B2 | 10/2012 | Dror et al. | |
| 8,341,486 B2 | 12/2012 | Rault et al. | |
| 8,755,363 B2 | 6/2014 | Sampath et al. | |
| 9,009,223 B2* | 4/2015 | Boucher | H04L 29/06 709/203 |
| 2003/0018794 A1* | 1/2003 | Zhang | H04L 29/06 709/231 |
| 2003/0123409 A1* | 7/2003 | Kwak | H04L 1/0061 370/335 |
| 2004/0064778 A1* | 4/2004 | Widdup | H03M 13/2714 714/758 |
| 2005/0276248 A1* | 12/2005 | Butala | H04L 1/20 370/332 |
| 2006/0020831 A1* | 1/2006 | Golla | G06F 1/32 713/300 |
| 2008/0049615 A1* | 2/2008 | Bugenhagen | H04L 43/0817 370/230.1 |
| 2008/0186988 A1* | 8/2008 | Carmon | H04L 1/0061 370/412 |
| 2008/0225965 A1* | 9/2008 | Pi | H04L 1/0003 375/260 |
| 2008/0259796 A1* | 10/2008 | Abousleman et al. | 370/233 |
| 2009/0019243 A1* | 1/2009 | Hur | G06F 1/3225 711/158 |
| 2009/0060088 A1* | 3/2009 | Callard | H04B 7/0689 375/299 |
| 2009/0204867 A1* | 8/2009 | Ho | H04L 1/1822 714/749 |
| 2009/0249165 A1* | 10/2009 | Gracie | H03M 13/296 714/758 |
| 2009/0313516 A1 | 12/2009 | Shin et al. | |
| 2010/0287435 A1* | 11/2010 | Tedrow | G11C 7/1045 714/748 |
| 2011/0295815 A1* | 12/2011 | Mandagere | G06F 11/1004 707/690 |
| 2012/0042226 A1* | 2/2012 | Ramesh | H03M 13/2975 714/758 |
| 2012/0069805 A1* | 3/2012 | Feuersanger | H04W 72/1284 370/329 |
| 2012/0083264 A1* | 4/2012 | Ramasamy et al. | 455/425 |
| 2012/0254703 A1 | 10/2012 | Rubin | |
| 2012/0281790 A1* | 11/2012 | Sokolov et al. | 375/341 |
| 2012/0327761 A1* | 12/2012 | Obuchi | H04L 1/1819 370/216 |
| 2012/0330481 A1* | 12/2012 | Feldkamp et al. | 701/2 |
| 2013/0141257 A1* | 6/2013 | Chiu | H04W 36/18 341/88 |
| 2013/0262953 A1* | 10/2013 | Deng | G06F 11/1004 714/752 |

FOREIGN PATENT DOCUMENTS

| | | |
|---|---|---|
| EP | 2416515 A2 | 2/2012 |
| WO | 2007050996 A2 | 5/2007 |
| WO | 2011034865 A1 | 3/2011 |

OTHER PUBLICATIONS

Samsung: "Analysis of per code block CRC and per transport block CRC", 3GPP TSG RAN WG#49-bis R1-073108, Jun. 20, 2007.
Uhlemann E, et al., "Packet combining and doping in concatenated hybrid ARQ schemes using iterative decoding", Wireless Communications and Networking, 2003. WCNC 2003. 2003 IEEE Mar. 16-20, 2003, Piscataway, NJ, USA,IEEE LNKD-D0I: 10.1109/WCNC.2003.1200482, vol. 2, Mar. 16, 2003 (Mar. 16, 2003), pp. 849-854, XP010639878.

* cited by examiner

METHODS AND APPARATUS FOR TURBO DECODER THROTTLING

CROSS-REFERENCE TO RELATED APPLICATIONS

This application claims benefit of U.S. Provisional Patent Application Ser. No. 61/666,106, filed 29 Jun. 2012, which is expressly incorporated by reference herein in its entirety.

BACKGROUND

Field

Certain aspects of the present disclosure generally relate to wireless communications and, more particularly, to apparatus and techniques for reducing turbo decoder power consumption with negligible impact to overall modem processing.

Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Code Division Multiple Access (CDMA) systems, Time Division Multiple Access (TDMA) systems, Frequency Division Multiple Access (FDMA) systems, 3rd Generation Partnership Project (3GPP) Long Term Evolution (LTE) systems, and Orthogonal Frequency Division Multiple Access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. The forward communication link and the reverse communication link may be established via a single-input single-output, multiple-input single-output or a multiple-input multiple-output system. To efficiently transmit and receive information, signals are usually encoded into a special format before transmission and decoded by a receiver after reception. Numerous encoding and decoding methods exist, with each presenting advantages and challenges, as well.

A wireless multiple-access communication system can support a time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point to extract transmit beamforming gain on the forward link when multiple antennas are available at the access point.

The 3GPP LTE represents a major advance in cellular technology and it is a next step forward in cellular $3^{rd}$ generation (3G) services as a natural evolution of Global System for Mobile Communications (GSM) and Universal Mobile Telecommunications System (UMTS). The LTE provides for an uplink speed of up to 75 megabits per second (Mbps) and a downlink speed of up to 300 Mbps, and brings many technical benefits to cellular networks. The LTE is designed to meet carrier needs for high-speed data and media transport as well as high-capacity voice support. The bandwidth may be scalable from 1.25 MHz to 20 MHz. This suits the requirements of different network operators that have different bandwidth allocations, and also allows operators to provide different services based on spectrum. The LTE is also expected to improve spectral efficiency in 3G networks, allowing carriers to provide more data and voice services over a given bandwidth.

Physical layer (PHY) of the LTE standard is a highly efficient means of conveying both data and control information between an enhanced base station (eNodeB) and mobile user equipment (UE). The LTE PHY employs advanced technologies that are new to cellular applications. These include Orthogonal Frequency Division Multiplexing (OFDM) and Multiple Input Multiple Output (MIMO) data transmission. In addition, the LTE PHY uses OFDMA on the downlink and Single Carrier—Frequency Division Multiple Access (SC-FDMA) on the uplink. OFDMA allows data to be directed to or from multiple users on a subcarrier-by-subcarrier basis for a specified number of symbol periods.

SUMMARY

Certain aspects of the present disclosure generally relate to wireless communication systems and, more specifically, to methods of turbo decoder throttling by a receiver in a wireless communication system.

In an aspect of the disclosure, a method for wireless communication is provided. The method generally comprises identifying an error in a received code block (CB) of a transport block (TB), and entering a throttle mode in a decoder at a user equipment (UE) in response to the identified error, wherein the throttle mode determines how one or more subsequent CBs are processed.

In an aspect of the disclosure, an apparatus for wireless communication is provided. The apparatus generally includes means for identifying an error in a received code block (CB) of a transport block (TB), and means for entering a throttle mode in a decoder at a user equipment (UE) in response to the identified error, wherein the throttle mode determines how one or more subsequent CBs are processed.

In an aspect of the disclosure, an apparatus for wireless communication is provided. The apparatus generally includes at least one processor and a memory coupled to the at least one processor. The at least one processor is generally configured to identify an error in a received code block (CB) of a transport block (TB), and enter a throttle mode in a decoder at a user equipment (UE) in response to the identified error, wherein the throttle mode determines how one or more subsequent CBs are processed.

In an aspect of the disclosure, a computer-program product for wireless communication is provided. The computer-program product generally includes a non-transitory computer-readable medium having code stored thereon. The code is generally executable by one or more processors for identifying an error in a received code block (CB) of a transport block (TB), and entering a throttle mode in a decoder at a user equipment (UE) in response to the identified error, wherein the throttle mode determines how one or more subsequent CBs are processed.

BRIEF DESCRIPTION OF THE DRAWINGS

Aspects and embodiments of the disclosure will become more apparent from the detailed description set forth below when taken in conjunction with the drawings in which like reference characters identify correspondingly throughout.

DETAILED DESCRIPTION

Figure 1:
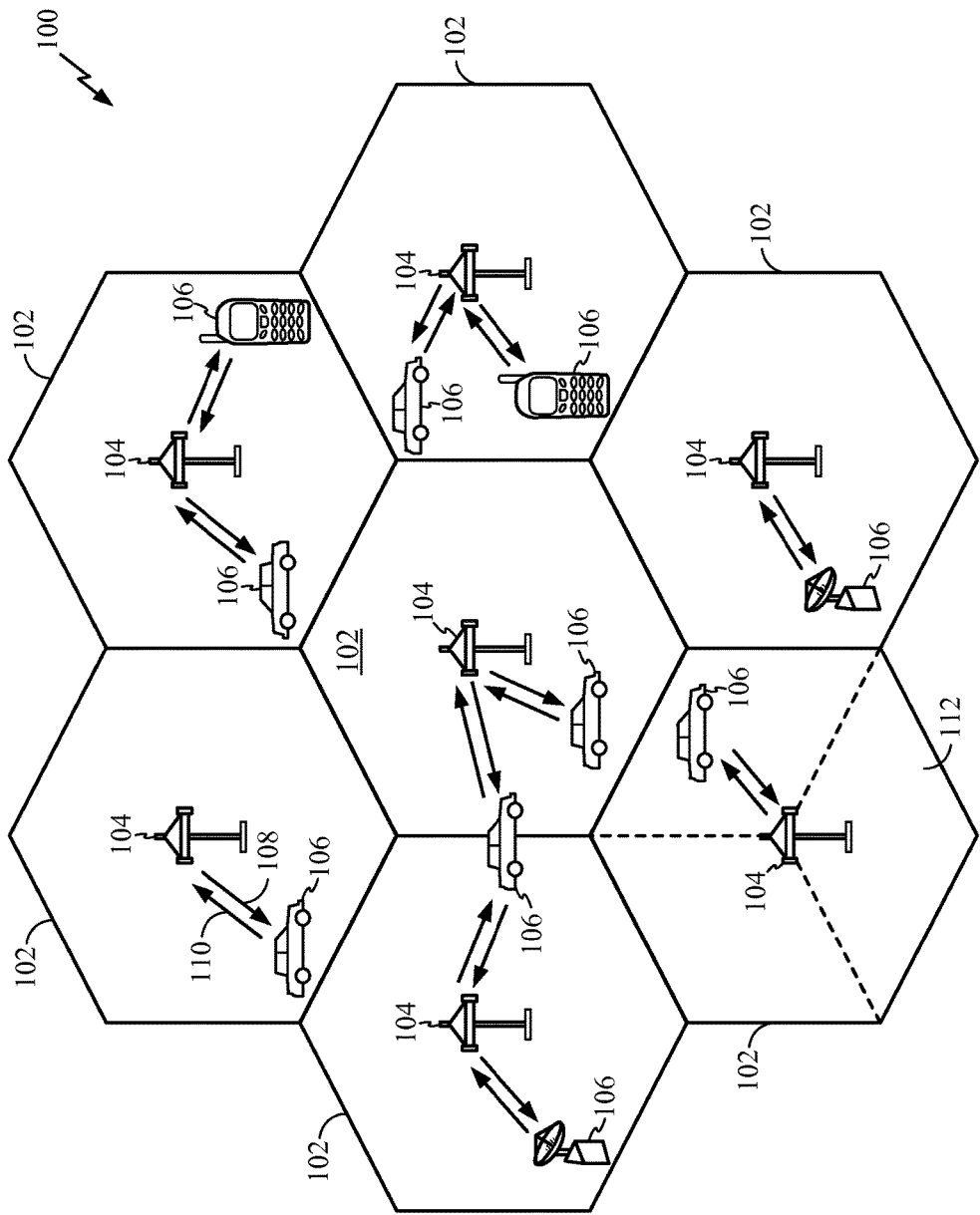
FIG. 1 illustrates an example wireless communication system, in accordance with certain aspects of the present disclosure.

As will be described in more detail herein, certain aspects of the present disclosure relate to techniques for reducing turbo decoder power consumption with negligible impact to overall modem processing. Aspects of the present disclosure provide techniques for a UE to enter a throttle mode, for example, upon identifying an error in a received code block. The throttle mode may determine how one or more subsequent code blocks may be processed, in an effort to limit power consumption at the UE.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Telecommunications System

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

An access terminal ("AT") may comprise, be implemented as, or known as an access terminal, a subscriber station, a subscriber unit, a mobile station, a remote station, a remote terminal, a user terminal, a user agent, a user device, user equipment ("UE"), a user station, a mobile unit, a wireless unit, a remote unit, a mobile device, a wireless device, a wireless communication device, a remote device, a mobile subscriber station, a mobile terminal, a wireless terminal, a handset, a mobile client, a client, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects a node is a wireless node. Such wireless node may provide, for example, connectivity for or to a network (e.g., a wide area network such as the Internet or a cellular network) via a wired or wireless communication link.

FIG. 1 illustrates an example of a wireless communication system 100 in which embodiments of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B, evolved Node B (eNB), a base transceiver station, a radio base station, a radio transceiver, a transceiver function, a basic service set (BSS), an extended service set (ESS), or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system.

A communication link that facilitates transmission from a base station 104 to a user terminal 106 may be referred to as a downlink 108, and a communication link that facilitates transmission from a user terminal 106 to a base station 104 may be referred to as an uplink 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
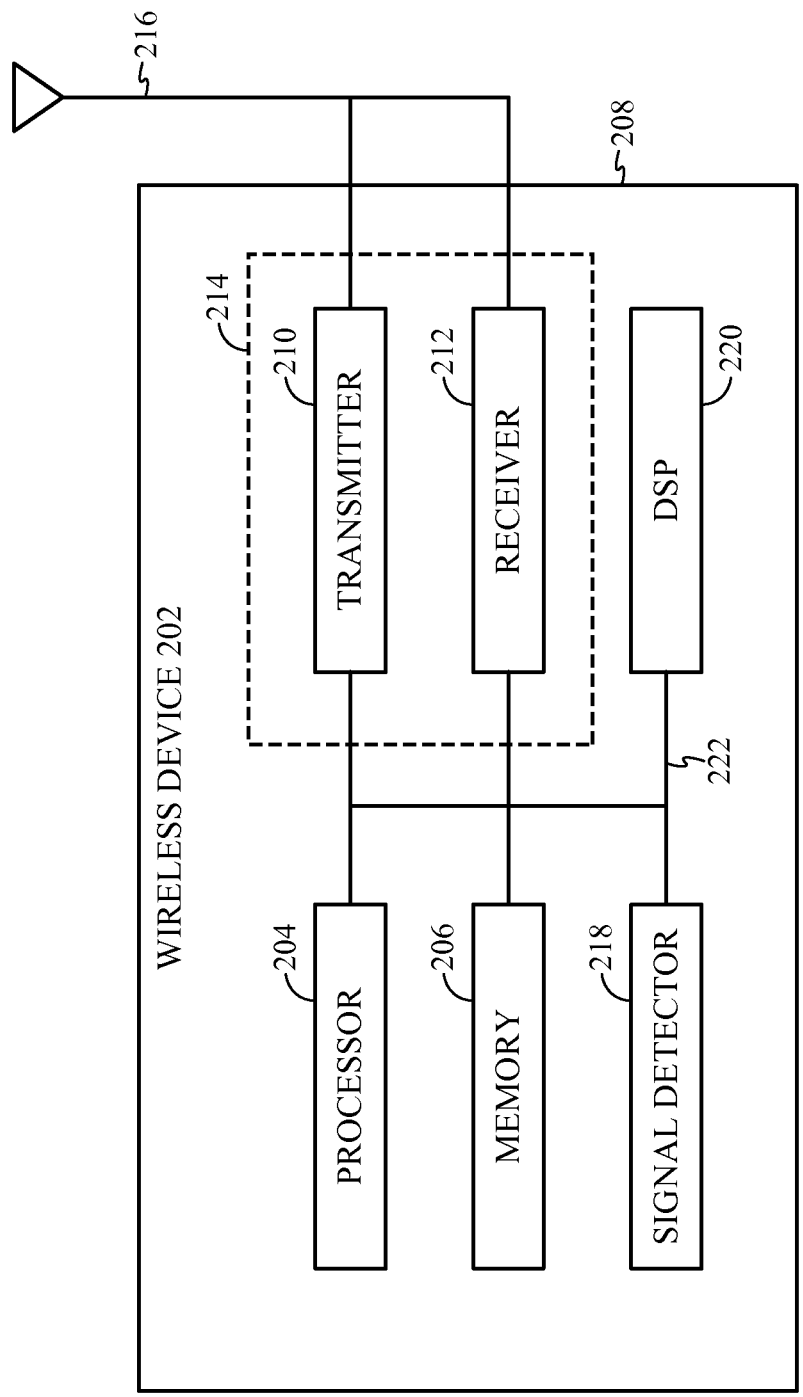
FIG. 2 illustrates various components that may be utilized in a wireless device, in accordance with certain aspects of the present disclosure.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, pilot energy per pseudonoise (PN) chips, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
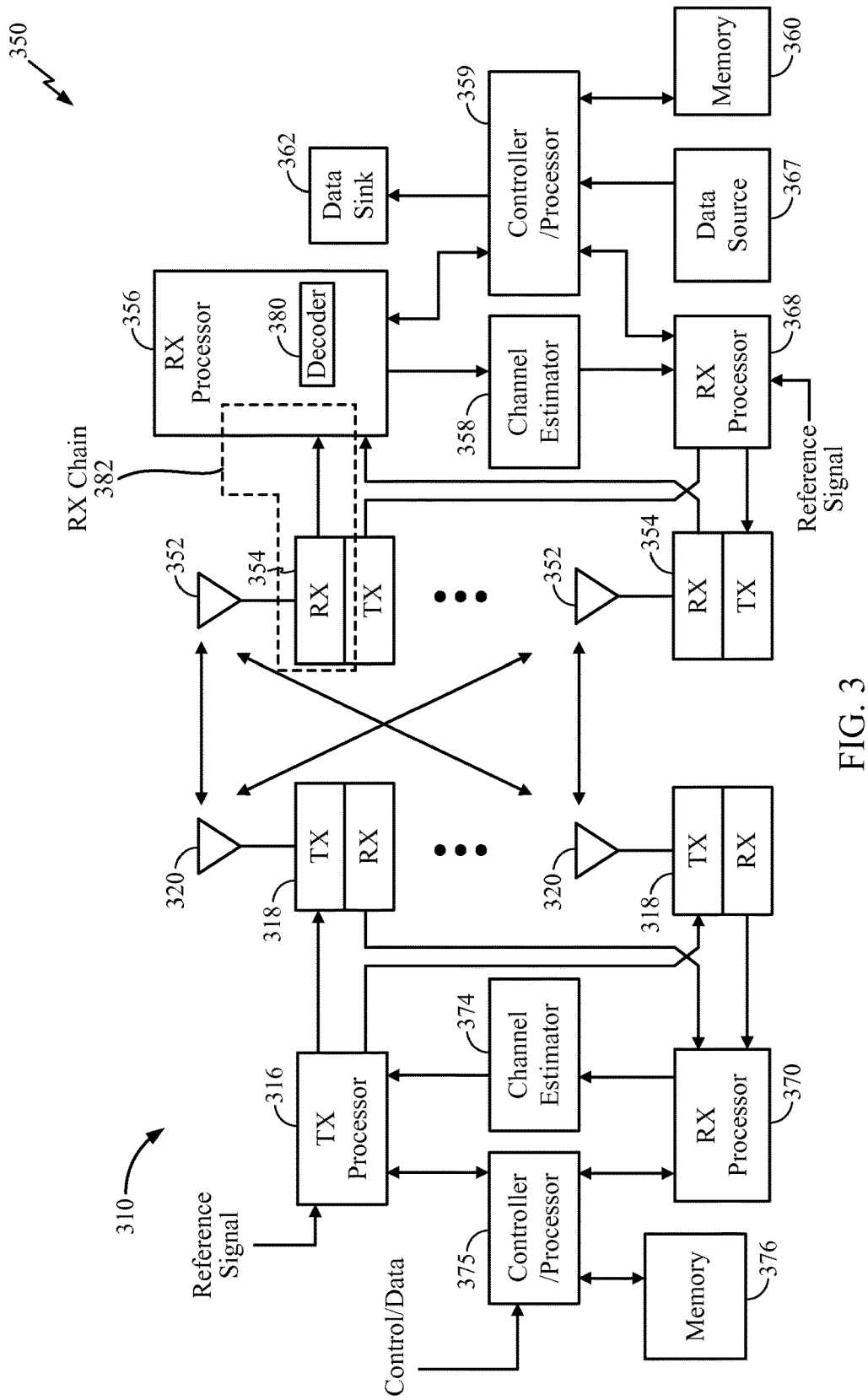
FIG. 3 illustrates a block diagram of an eNB in communication with a UE in an access network, in accordance with aspects of the present disclosure.

FIG. 3 is a block diagram of an eNB 310 in communication with a UE 350 in an access network. In the DL, upper layer packets from the core network are provided to a controller/processor 375. The controller/processor 375 implements the functionality of the L2 layer. In the DL, the controller/processor 375 provides header compression, ciphering, packet segmentation and reordering, multiplexing between logical and transport channels, and radio resource allocations to the UE 350 based on various priority metrics. The controller/processor 375 is also responsible for HARQ operations, retransmission of lost packets, and signaling to the UE 350.

The TX processor 316 implements various signal processing functions for the L1 layer (i.e., physical layer). The signal processing functions include coding and interleaving to facilitate forward error correction (FEC) at the UE 350 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream is then provided to a different antenna 320 via a separate transmitter 318TX. Each transmitter 318TX modulates an RF carrier with a respective spatial stream for transmission.

At the UE 350, each transmitter/receiver module 354 receives a signal through its respective antenna 352. Each transmitter/receiver module 354 recovers information modulated onto an RF carrier and provides the information to the receiver (RX) processor 356. The RX processor 356 implements various signal processing functions of the L1 layer. The RX processor 356 performs spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal is recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359.

The controller/processor 359 implements the L2 layer. The controller/processor can be associated with a memory 360 that stores program codes and data. The memory 360 may be referred to as a computer-readable medium. In the UL, the control/processor 359 provides demultiplexing between transport and logical channels, packet reassembly, deciphering, header decompression, control signal processing to recover upper layer packets from the core network. The upper layer packets are then provided to a data sink 362, which represents all the protocol layers above the L2 layer. Various control signals may also be provided to the data sink 362 for L3 processing. The controller/processor 359 is also responsible for error detection using an acknowledgement (ACK) and/or negative acknowledgement (NACK) protocol to support HARQ operations.

In the UL, a data source 367 is used to provide upper layer packets to the controller/processor 359. The data source 367 represents all protocol layers above the L2 layer. Similar to the functionality described in connection with the DL transmission by the eNB 310, the controller/processor 359 implements the L2 layer for the user plane and the control plane by providing header compression, ciphering, packet segmentation and reordering, and multiplexing between logical and transport channels based on radio resource allocations by the eNB 310. The controller/processor 359 is also responsible for HARQ operations, retransmission of lost packets, and signaling to the eNB 310.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 are provided to different antenna 352 via separate transmitter/receiver modules 354. Each transmitter/receiver module 354 modulates an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370. The RX processor 370 may implement the L1 layer.

The controller/processor 375 implements the L2 layer. The controller/processor 375 can be associated with a memory 376 that stores program codes and data. The memory 376 may be referred to as a computer-readable medium. In the UL, the control/processor 375 provides demultiplexing between transport and logical channels, packet reassembly, deciphering, header decompression, control signal processing to recover upper layer packets from the UE 350. Upper layer packets from the controller/processor 375 may be provided to the core network. The controller/processor 375 is also responsible for error detection using an ACK and/or NACK protocol to support HARQ operations.

As will be explained in more detail herein, a transmitter, such as the eNB 310, may transmit one or more transport blocks (TBs) to a receiver, which may include one or more components of the UE 350. Receiver chain 382 and decoder 380 may perform aspects of the present disclosure. For example, and as illustrated in FIG. 3, the receiver component of the transmitter/receiver module 354 and RX processor 356 of the receiver chain 382 may identify an error in a received code block (CB) of a TB. In response to the identified error, a decoder 380 of the UE 350 may enter a throttle mode. The throttle mode may determine how one or more subsequent CBs are processed by the UE 350. Components of the receiver chain 382 may be understood in more detail with reference to the receiver chain 400 illustrated in FIG. 4 and described herein.

Figure 4:
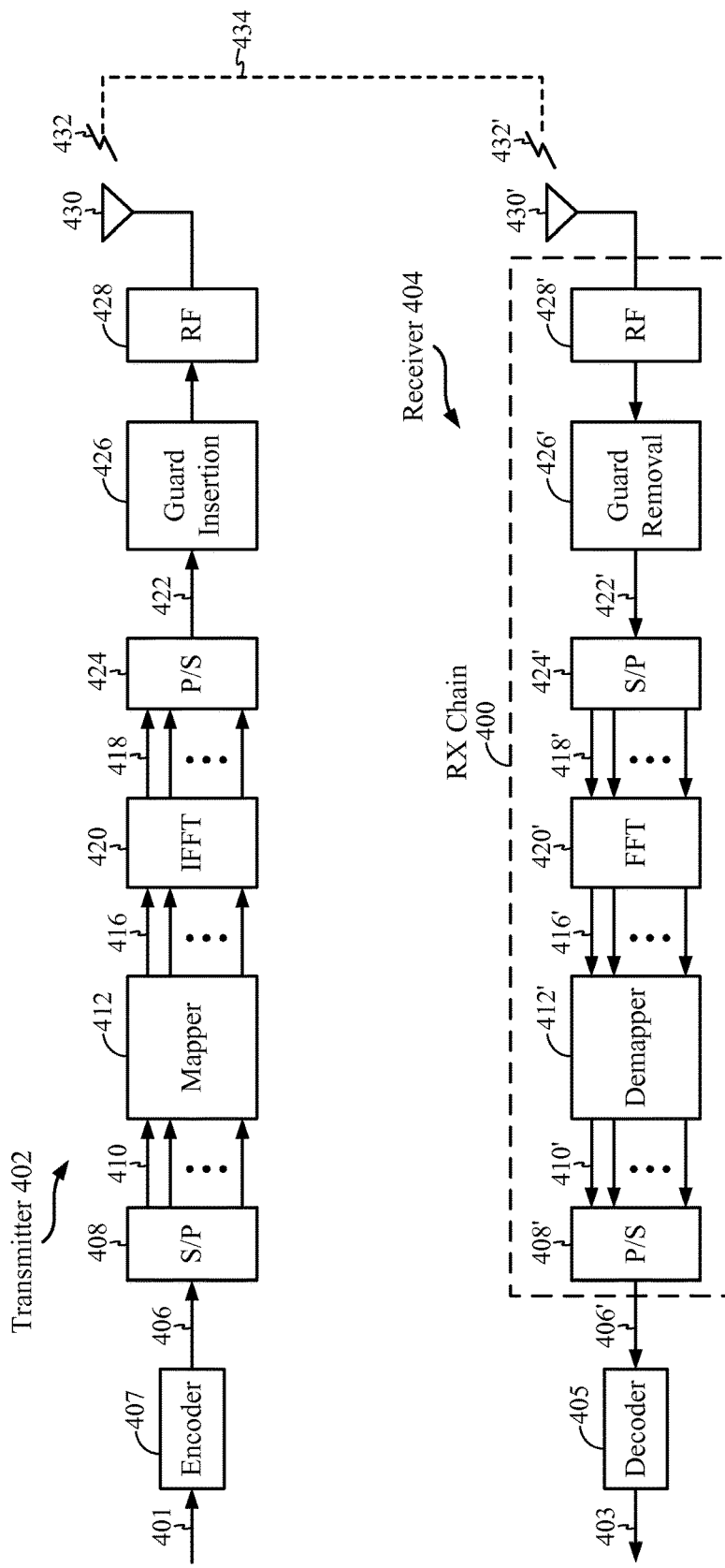
FIG. 4 illustrates an example transmitter and an example receiver that may be used within a wireless communication system, in accordance with certain aspects of the present disclosure.

FIG. 4 illustrates an example of a transmitter 402 that may be used within a wireless communication system 100. Portions of the transmitter 402 may be implemented in a transmitter 210 of a wireless device 202 as illustrated in FIG. 2. The transmitter 402 may be implemented in a base station 104, 310 for transmitting data 406 to a user terminal 106, 350 on a downlink 108. The transmitter 402 may also be implemented in a user terminal 106, 350 for transmitting data 406 to a base station 104, 310 on an uplink 110.

An encoder 407 may alter a signal (e.g., a bitstream) 401 into data 406. Data 406 to be transmitted is provided from the encoder 407 as input to a serial-to-parallel (S/P) converter 408. The S/P converter 408 may split the transmission data into N parallel data streams 410.

The N parallel data streams 410 may then be provided as input to a mapper 412. The mapper 412 may map the N parallel data streams 410 onto N constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 412 may output N parallel symbol streams 416, each symbol stream 416 corresponding to one of the N orthogonal subcarriers of the inverse fast Fourier transform (IFFT) 420. These N parallel symbol streams 416 are represented in the frequency domain and may be converted into N parallel time domain sample streams 418 by an IFFT component 420.

A brief note about terminology will now be provided. N parallel modulations in the frequency domain are equal to N modulation symbols in the frequency domain, which are equal to N mapping and N-point IFFT in the frequency domain, which is equal to one (useful) OFDM symbol in the time domain, which is equal to N samples in the time domain. One OFDM symbol in the time domain, $N_s$, is equal to $N_{cp}$ (the number of guard samples per OFDM symbol)+N (the number of useful samples per OFDM symbol).

The N parallel time domain sample streams 418 may be converted into an OFDM/OFDMA symbol stream 422 by a parallel-to-serial (P/S) converter 424. A guard insertion component 426 may insert a guard interval between successive OFDM/OFDMA symbols in the OFDM/OFDMA symbol stream 422. The output of the guard insertion component 426 may then be upconverted to a desired transmit frequency band by a radio frequency (RF) front end 428. An antenna 430 may then transmit the resulting signal 432.

FIG. 4 also illustrates an example of a receiver 404 that may be used within a wireless device 202 that utilizes OFDM/OFDMA. Portions of the receiver 404 may be implemented in the receiver 212 of a wireless device 202. The receiver 404 may be implemented in a user terminal 106, 350 for receiving data 406 from a base station 104, 310 on a downlink 108. For example, receiver chain 382 illustrated in FIG. 3 may include components illustrated in receiver chain 400. The receiver chain 404 may also be implemented in a base station 104, 310 for receiving data 406 from a user terminal 106, 350 on an uplink 110.

The transmitted signal 432 is shown traveling over a wireless channel 434 from the transmitter 402 to the receiver 404. When a signal 432' is received by an antenna 430', the received signal 432' may be downconverted to a baseband signal by an RF front end 428'. A guard removal component 426' may then remove the guard interval that was inserted between OFDM/OFDMA symbols by the guard insertion component 426.

The output of the guard removal component 426' may be provided to an S/P converter 424'. The S/P converter 424' may divide the OFDM/OFDMA symbol stream 422' into the N parallel time-domain symbol streams 418', each of which corresponds to one of the N orthogonal subcarriers. A fast Fourier transform (FFT) component 420' may convert the N parallel time-domain symbol streams 418' into the frequency domain and output N parallel frequency-domain symbol streams 416'.

A demapper 412' may perform the inverse of the symbol mapping operation that was performed by the mapper 412 thereby outputting N parallel data streams 410'. A P/S converter 408' may combine the N parallel data streams 410' into a single data stream 406'. Ideally, this data stream 406' corresponds to the data 406 that was provided as input to the transmitter 402. Following the combination of the N parallel data streams 410' into a single data stream 406', the data stream 406' may be decoded into a decoded data stream 403 by decoder 405 through decoding methods including, for example, turbo decoding. Decoder 405 may correspond to decoder 380 of the RX processor 356 illustrated in FIG. 3.

Turbo Decoder Throttling

Aspects of the present disclosure provide techniques for turbo decoder throttling in an effort to reduce power consumption at a receiver modem. For downlink in LTE, the power consumption of a UE modem turbo decoder (TDEC) may be related to a data rate and a number of iterations run per code-block (CB). At high data rates, each transport block (TB) may be composed of multiple CBs.

As will be described in more detail herein, TDEC throttling may reduce TDEC power consumption in a failing TB scenario, for example, by skipping the decoding of subsequent CBs of a TB once the receiver has determined that the TB transmission may fail. According to aspects of the present disclosure, the receiver may still save and combine the Log-Likelihood Ratios (LLRs) of non-decoded CBs for re-attempting to decode the CBs during one or more subsequent retransmissions of the corresponding TB.

As described in LTE specifications, each TB on the Physical Downlink Shared Channel (PDSCH) channel may be broken into multiple CBs when the transport block size (TBS) is greater than 6120 bits. As TB sizes may exceed, for example, 75,000 bits, multiple CBs may be needed to transmit TBs.

The number of CBs per TB may be given by code block segmentation rules described in, for example, 36.212 of the LTE specification. Following the addition of the TB cyclic redundancy check (CRC) of length L=24 to a TB of size A, the number of TB bits may be equal to:

$$B = A + L$$

The maximum CB size may be Z=6144 bits. When B≤Z, there may be only one CB. Therefore, no addition CB CRC may be appended. However, when B>Z, there may be more than one CB in the TB. Accordingly, a 24-bit CRC may be added to each CB. Given the above constraints, when B>Z, the number of CBs may be equal to:

$$C = \left\lceil \frac{B}{(Z-L)} \right\rceil$$

Figure 5:
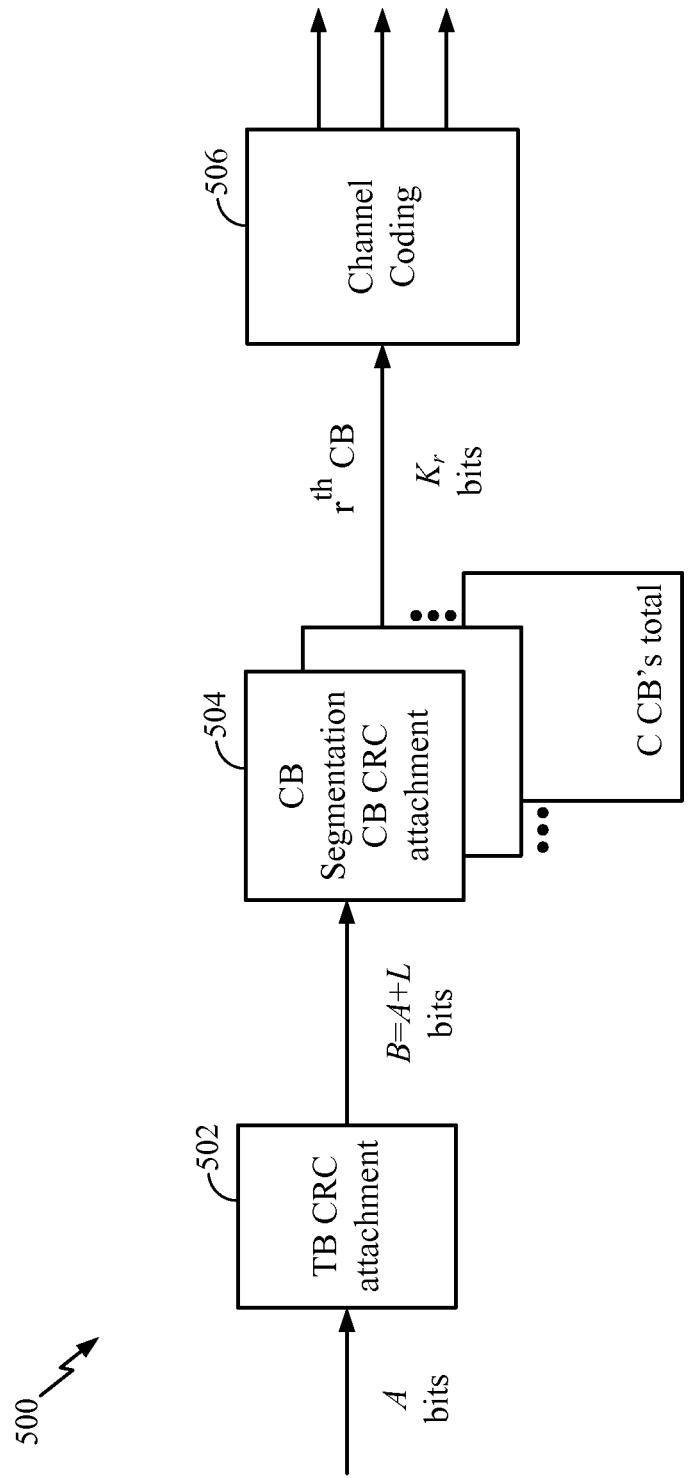
FIG. 5 illustrates example operations performed by a transmitter, in accordance with certain aspects of the present disclosure.

FIG. 5 illustrates an example CRC attachment and CB segmentation 500 according to aspects of the present disclosure. A transmitter (e.g., transmitter 310 of FIG. 3, transmitter 402 of FIG. 4) may attach a CRC to each TB at 502. After TB CRC attachment, the TB may be divided into a number of CBs (e.g., C). At 504, the transmitter may perform CB segmentation and CB CRC attachment for each of the C code blocks. At 506, the transmitter may perform channel coding for the CBs.

As would be apparent to those skilled in the art, a receiver (e.g., one or more components of UE 350 of FIG. 3, including, for example, at least the receiver chain 356 and decoder 380, and/or one or more components of receiver 404 of FIG. 4, including, for example, receiver chain 400 and decoder 405) may perform corresponding, receiver operations. For example, the receiver may receive a channel and may decode each of C CBs independently. For each C code block, the receiver may calculate a corresponding CRC. After decoding each CB, the receiver may have B bits and may calculate the CRC for the TB.

In general, there may be a TDEC performance gain for allowing a larger number of maximum half iterations (HI). From a time perspective, each LTE subframe lasts 1 ms. In a symmetric MIMO scenario with two TBs of the same size, the maximum allocated TDEC processing time for a given TB may not exceed a set time (e.g., a predetermined number of microseconds). In general, a relatively linear relationship exists between power consumption and a number of HI which the TDEC runs per CB.

According to aspects of the present disclosure, TDEC power consumption may be reduced while preserving adequate LTE modem (e.g., receiver) performance by allocating a potentially large number of TDEC iterations for each CB and only running the turbo decoder iterations when it may be useful for the successful passing of a TB.

There may be little utility in running the TDEC for subsequent CBs of a TB once any of the CBs have failed CB CRC check. For example, as explained above, TBs, of size greater than 6120 bits, may be broken into multiple, independently coded CBs. Since TB CRC calculation spans all of the CBs in a TB, if any of the CBs fail CB CRC check, there may be a high likelihood that the TB CRC may fail as well.

With the HARQ implementation of LTE PDSCH, a transmitter may retransmit an entire TB when the TB fails CRC check and it was not the final transmission of that TB. During the retransmission, the LLRs associated with prior transmissions of CBs (e.g., LLRs for each CB) corresponding to the retransmitted TB may be combined with LLRs from the new transmission of the CBs. The HARQ combined CB LLRs may be fed into the TDEC to re-attempt decoding at the receiver.

TDEC throttling may modify decoding for one or more remaining CBs of the TB after any CB fails its CB CRC check. For example, TDEC throttling may conditionally program the TDEC to throttle down to (e.g., perform) zero half iterations for one or more subsequent CBs (e.g., all remaining CBs) of the TB after any CB fails its CB CRC check. The TDEC throttling feature may reduce power consumption from the failing TB scenario since each CB would otherwise run to the full maximum number of half iterations in an effort for a successful decode. In some aspects, TDEC throttling may include preventing decoding of one or more subsequent CBs of the TB after any CB fails its CB CRC check. In aspects, the TDEC may still compute the TB CRC. In some aspects, the TDEC throttling may include powering down the decoder for a period of time. Thereafter, the decoder may be turned back on for a period of time. In some aspects, the decoder may set a flag to indicate it has entered a throttle mode.

Inter-CB TDEC pipelining may be implemented such that the CB CRC may not be in the critical path between each CB when the TDEC is running to its maximum number of iterations. Accordingly, when the first CB to fail within a TB does so on its last iteration, the TDEC may have already begun iterative decoding on the next CB based on, for example, the prior programmed valued of the maximum number of iterations. Thus, if the first CB to fail is $CB_n$, it may be possible that $CB_{n+1}$ may be unthrottled, while $CB_{n+2}$ may be throttled since the $CB_n$ CRC value may not be known prior to the $CB_{n+1}$ being dispatched. According to aspects of the present disclosure, the TDEC may throttle all remaining CBs of the TB, in an effort to reduce overall modem processing. In this manner, the TDEC may modify decoding for one or more remaining CBs of the TB after any CB fails its CB CRC check beginning at a subsequent CB of the TB. In some aspects, the TDEC may modify decoding for one or more remaining CBs of the TB after any CB fails its CB CRC check beginning at a next sequential CB of the TB.

Figure 6:
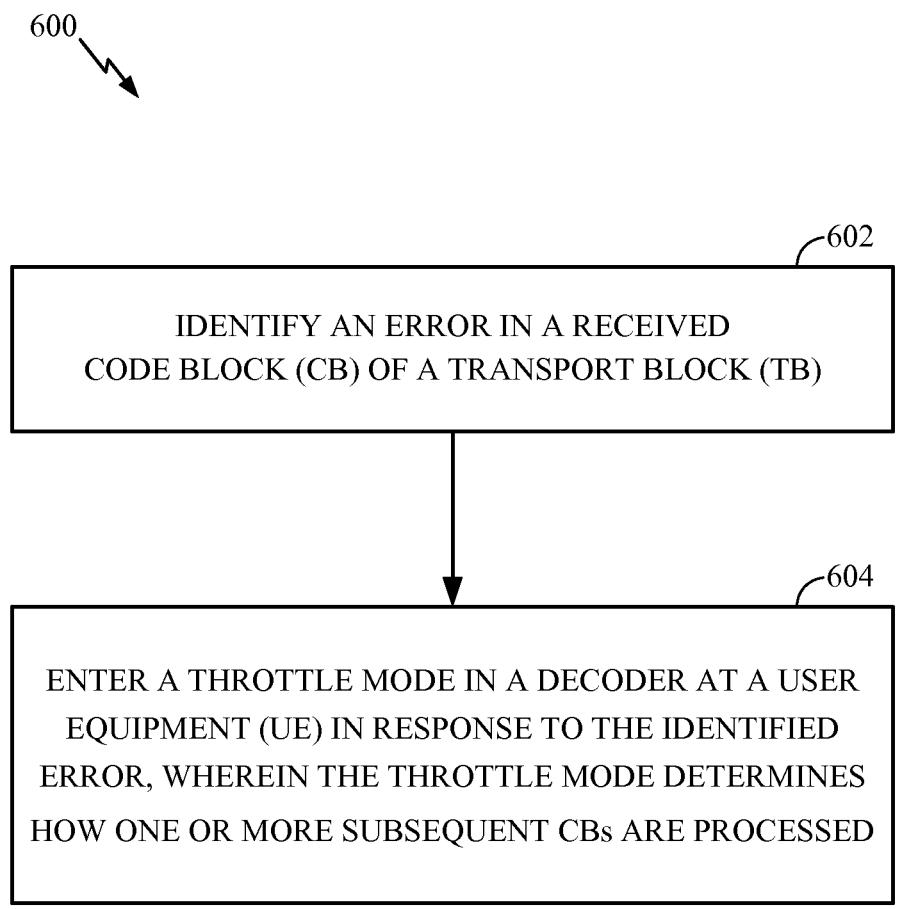
FIG. 6 is a flow diagram illustrating example operations for turbo decoder throttling, in accordance with certain aspects of the present disclosure.

FIG. 6 is a flow diagram of example operations 600 for turbo decoder throttling, according to aspects of the present disclosure. The operations 600 may be performed, for example, by a receiver implemented as one or more components included in the UE 350 of FIG. 3 implemented at UE 106 of FIG. 1. For example, the operations 600 may be performed by a receiver chain 382 and a decoder 380 as illustrated in FIG. 3.

The operations 600 may begin, at 602, by identifying an error in a received code block (CB) of a transport block (TB). At 604, the UE may enter a throttle mode in a decoder in response to the identified error, wherein the throttle mode determines how one or more subsequent CBs are processed.

According to aspects of the present disclosure, the error identified by the UE may comprise a failed CRC of the received CB. Upon identifying an error, the UE may modify decoding beginning at a subsequent CB. As described above, the UE may modify decoding beginning at a next sequential CB. As described above, the UE may prevent decoding of one or more subsequent CBs of the TB and may perform a CRC of the TB. According to aspects, the UE may demodulate CBs of the TB, at least in part, for future use in reattempting to decode during a subsequent retransmission of the TB.

As explained herein, the TDEC throttling feature may reduce power consumption in the failing TB scenario, for example, by not decoding CBs for a TB transmission which may fail. This may be different than passing CBs and TBs targeted by the TDEC early termination feature (e.g., wherein a UE may stop decoding CBs as soon as the CB has passed). Thus, the TDEC early termination feature described herein seeks to reduce TDEC power consumption for passing CBs by having an early exit criterion without running to the maximum number of HI. In aspects, the present methods and apparatus may be employed in conjunction with the early termination feature.

The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

As used herein, a phrase referring to "at least one of" a list of items refers to any combination of those items, including single members. As an example, "at least one of: a, b, or c" is intended to cover: a, b, c, a-b, a-c, b-c, and a-b-c.

While the foregoing is directed to embodiments of the present disclosure, other and further embodiments of the disclosure may be devised without departing from the basic scope thereof, and the scope thereof is determined by the claims that follow.

What is claimed is:

1. A method for wireless communication, comprising:
   identifying, at a user equipment (UE), a failed cyclic redundancy check (CRC) of a received code block (CB) of a transport block (TB) on a physical channel after decoding the received CB, wherein the received CB is part of the TB; and entering a throttle mode in a decoder at the UE in response to the failed CRC of the received CB of the TB, wherein the throttle mode determines how one or more subsequent CBs are processed, wherein entering the throttle mode comprises conditionally programming the decoder to perform zero half iterations for the one or more subsequent CBs of the TB.

2. The method of claim 1, wherein entering the throttle mode comprises:
modifying decoding beginning at a subsequent CB of the TB.

3. The method of claim 1, wherein entering the throttle mode comprises:
modifying decoding beginning at a next sequential CB of the TB.

4. The method of claim 1, wherein entering the throttle mode comprises:
conditionally programming the decoder to perform zero half iterations beginning at a subsequent CB of the TB.

5. The method of claim 1, wherein entering the throttle mode comprises:
conditionally programming the decoder to perform zero half iterations beginning at a next sequential CB of the TB.

6. The method of claim 1, wherein entering the throttle mode comprises:
preventing decoding of the one or more subsequent CBs of the TB.

7. The method of claim 6, further comprising:
performing a CRC of the TB.

8. The method of claim 1, wherein entering the throttle mode comprises:
powering down the decoder for a period of time.

9. An apparatus for wireless communication, comprising:
means for identifying, at a user equipment (UE), a failed cyclic redundancy check (CRC) of a received code block (CB) of a transport block (TB) on a physical channel after decoding of the received CB, wherein the received CB is part of the TB; and
means for entering a throttle mode in a decoder at the UE in response to the failed CRC of the received CB of the TB, wherein the throttle mode determines how one or more subsequent CBs are processed, wherein the means for entering the throttle mode is configured to conditionally program the decoder to perform zero half iterations for the one or more subsequent CBs of the TB.

10. The apparatus of claim 9, wherein the means for entering the throttle mode is configured to modify decoding beginning at a subsequent CB of the TB.

11. The apparatus of claim 9, wherein the means for entering the throttle mode is configured to modify decoding beginning at a next sequential CB of the TB.

12. The apparatus of claim 9, wherein the means for entering the throttle mode is configured to conditionally program the decoder to perform zero half iterations beginning at a subsequent CB of the TB.

13. The apparatus of claim 9, wherein the means for entering the throttle mode is configured to conditionally program the decoder to perform zero half iterations beginning at a next sequential CB of the TB.

14. The apparatus of claim 9, wherein the means for entering the throttle mode is configured to prevent decoding of the one or more subsequent CBs of the TB.

15. The apparatus of claim 14, further comprising:
means performing a CRC of the TB.

16. The apparatus of claim 9, wherein the means for entering the throttle mode is configured to power down the decoder for a period of time.

17. An apparatus for wireless communication, comprising:
at least one processor configured to:
identify, at a user equipment (UE), a failed cyclic redundancy check (CRC) of a received code block (CB) of a transport block (TB) on a physical channel after decoding of the received CB, wherein the received CB is part of the TB; and
enter a throttle mode in a decoder at the UE in response to the failed CRC of the received CB of the TB, wherein the throttle mode determines how one or more subsequent CBs are processed, wherein the at least one processor is configured to enter the throttle mode by conditionally programming the decoder to perform zero half iterations for the one or more subsequent CBs of the TB; and
a memory coupled to the at least one processor.

18. The apparatus of claim 17, wherein the at least one processor is configured to enter the throttle by modifying decoding beginning at a subsequent CB of the TB.

19. The apparatus of claim 17, wherein the at least one processor is configured to enter the throttle mode by modifying decoding beginning at a next sequential CB of the TB.

20. The apparatus of claim 17, wherein the at least one processor is configured to enter the throttle mode by conditionally programming the decoder to perform zero half iterations beginning at a subsequent CB of the TB.

21. The apparatus of claim 17, wherein the at least one processor is configured to enter the throttle mode by conditionally programming the decoder to perform zero half iterations beginning at a next sequential CB of the TB.

22. The apparatus of claim 17, wherein the at least one processor is configured to enter the throttle mode by preventing decoding of the one or more subsequent CBs of the TB.

23. The apparatus of claim 22, wherein the at least one processor is further configured to:
perform a CRC of the TB.

24. The apparatus of claim 17, wherein the at least one processor is configured to enter the throttle by powering down the decoder for a period of time.

25. A non-transitory computer-readable medium for wireless communication, the non-transitory computer-readable medium having code stored thereon, the code executable by one or more processors for:
identifying, at a user equipment (UE), a failed cyclic redundancy check (CRC) of a received code block (CB) of a transport block (TB) on a physical channel after decoding of the received CB, wherein the received CB is part of the TB; and
entering a throttle mode in a decoder at the UE in response to the failed CTC of the received CB of the TB, wherein the throttle mode determines how one or more subsequent CBs are processed, wherein the code for entering the throttle mode comprises code for conditionally programming the decoder to perform zero half iterations for the one or more subsequent CBs of the TB.

26. The non-transitory computer-readable medium of claim 25, wherein the code for entering the throttle mode comprises:
code for modifying decoding beginning at a subsequent CB of the TB.

27. The non-transitory computer-readable medium of claim 25, wherein the code for entering the throttle mode comprises:
  code for modifying decoding beginning at a next sequential CB of the TB.

28. The non-transitory computer-readable medium of claim 25, wherein the code for entering the throttle mode comprises:
  code for conditionally programming the decoder to perform zero half iterations beginning at a subsequent CB of the TB.

29. The non-transitory computer-readable medium of claim 25, wherein the code for entering the throttle mode comprises:
  code for conditionally programming the decoder to perform zero half iterations beginning at a next sequential CB of the TB.

30. The non-transitory computer-readable medium of claim 25, wherein the code for entering the throttle mode comprises:
  code for preventing decoding of the one or more subsequent CBs of the TB.

31. The non-transitory computer-readable medium of claim 30, further comprising:
  code for performing a CRC of the TB.

32. The non-transitory computer-readable medium of claim 25, wherein the code for entering the throttle mode comprises:
  code for powering down the decoder for a period of time.

33. The method of claim 1, wherein the failed CRC is not in a critical path between the received CB and the subsequent CBs within the TB.

34. The method of claim 1, wherein entering the throttle mode comprises:
  conditionally programming the decoder to perform zero half iterations for all of the subsequent CBs within the TB.

35. The apparatus of claim 9, wherein the failed CRC is not in a critical path between the received CB and the subsequent CBs within the TB.

36. The apparatus of claim 9, wherein the means for entering the throttle mode is configured to conditionally program the decoder to perform zero half iterations for all of the subsequent CBs within the TB.

37. The apparatus of claim 17, wherein the failed CRC is not in a critical path between the received CB and the subsequent CBs within the TB.

38. The apparatus of claim 17, wherein the at least one processor is configured to enter the throttle mode by conditionally programming the decoder to perform zero half iterations for all of the subsequent CBs within the TB.

39. The non-transitory computer-readable medium of claim 25, wherein the failed CRC is not in a critical path between the received CB and the subsequent CBs within the TB.

40. The non-transitory computer-readable medium of claim 25, wherein the code for entering the throttle mode comprises:
  code for conditionally programming the decoder to perform zero half iterations for all of the subsequent CBs within the TB.

* * * * *